(12) United States Patent
Li et al.

(10) Patent No.: US 10,582,099 B2
(45) Date of Patent: Mar. 3, 2020

(54) SAMPLE HEIGHT MEASUREMENT USING DIGITAL GRATING

(71) Applicant: Zhongke Jingyuan Electron Limited, Beijing (CN)

(72) Inventors: Shiguang Li, Beijing (CN); Jie Guo, Beijing (CN)

(73) Assignee: Zhongke Jingyuan Electron Limited, Beijing (CN)

( * ) Notice: Subject to any disclaimer, the term of this patent is extended or adjusted under 35 U.S.C. 154(b) by 54 days.

(21) Appl. No.: 15/972,756

(22) Filed: May 7, 2018

(65) Prior Publication Data

US 2019/0320097 A1    Oct. 17, 2019

(30) Foreign Application Priority Data

Apr. 17, 2018   (CN) .......................... 2018 1 0343087

(51) Int. Cl.
| | |
|---|---|
| *H04N 7/18* | (2006.01) |
| *H04N 5/225* | (2006.01) |
| *G06T 7/521* | (2017.01) |
| *H04N 5/232* | (2006.01) |
| *H04N 5/372* | (2011.01) |
| *H04N 5/374* | (2011.01) |

(52) U.S. Cl.
CPC .......... *H04N 5/2253* (2013.01); *G06T 7/521* (2017.01); *H04N 5/2256* (2013.01); *H04N 5/23212* (2013.01); *H04N 5/372* (2013.01); *H04N 5/374* (2013.01)

(58) Field of Classification Search
CPC .................................................. H04N 5/2253
USPC ........................................................ 348/135
See application file for complete search history.

(56) References Cited

U.S. PATENT DOCUMENTS

| | | | | |
|---|---|---|---|---|
| 5,510,892 A | * | 4/1996 | Mizutani | G01B 11/26 250/559.37 |
| 6,027,841 A | * | 2/2000 | Suzuki | H01J 37/3174 430/296 |
| 6,354,012 B1 | * | 3/2002 | Pettersson | G01B 7/008 33/503 |
| 7,024,066 B1 | * | 4/2006 | Malendevich | G02B 6/122 356/614 |
| 8,860,937 B1 | * | 10/2014 | Dziura | G01N 21/47 356/237.4 |
| 2002/0021460 A1 | * | 2/2002 | Hansen | G03F 7/70375 359/1 |
| 2005/0219553 A1 | * | 10/2005 | Kelly | G01B 11/16 356/605 |
| 2005/0254129 A1 | * | 11/2005 | Clark | G02B 3/08 359/573 |

(Continued)

*Primary Examiner* — Leron Beck
(74) *Attorney, Agent, or Firm* — Young Basile Hanlon & MacFarlane, P.C.

(57) ABSTRACT

A method, an apparatus, and a non-transitory computer-readable medium for measuring a height of a sample includes: receiving, by an optical sensor having pixels, an optical grating image of an illuminated optical grating reflected by a surface of the sample; determining, by a processor, a digital grating image by keeping values of first pixels of the optical grating image and resetting values of second pixels of the optical grating image; and determining the height based on a relationship between an integrated intensity of a portion of the digital grating image and the height.

20 Claims, 13 Drawing Sheets

(56) References Cited

U.S. PATENT DOCUMENTS

| | | | | |
|---|---|---|---|---|
| 2006/0077400 A1* | 4/2006 | Zwemer | ............... | G01B 11/254 |
| | | | | 356/605 |
| 2006/0146326 A1* | 7/2006 | Nagashima | ............... | G01J 3/02 |
| | | | | 356/328 |
| 2006/0221316 A1* | 10/2006 | Yamamoto | .............. | G03F 7/702 |
| | | | | 355/53 |
| 2008/0063260 A1* | 3/2008 | Lin | .................... | G01B 11/2509 |
| | | | | 382/154 |
| 2009/0051893 A1* | 2/2009 | Shibazaki | ........... | G03F 7/70775 |
| | | | | 355/72 |
| 2015/0309297 A1* | 10/2015 | Westphal | ............. | G02B 21/244 |
| | | | | 359/363 |

\* cited by examiner

SAMPLE HEIGHT MEASUREMENT USING DIGITAL GRATING

CROSS-REFERENCE TO RELATED APPLICATION(S)

This application claims priority to Chinese Patent Application No. 201810343087.0, filed on Apr. 17, 2018, the content of which is hereby incorporated by reference in its entirety.

TECHNICAL FIELD

This disclosure relates to measurement and focus control of a sample height capable of specular reflection, in particular, to the measurement of a sample height.

BACKGROUND

In semiconductor manufacturing, a wafer can be put on a stage for lithography or inspection. The height of the wafer is an important metrology parameter and can be adjusted for best focus of the incident light or charged beams. The wafer typically has a highly reflective or mirror-like surface. An optical apparatus can image an optical grating onto the surface of the wafer with an incident angle using illumination for height measurement. The reflected light can form an optical grating image. The optical grating image changes when the wafer height changes. The displacement of the optical grating image can be related to the wafer height changes, based on which the wafer height can be measured.

Optical sensors, such as charge-coupled device (CCD) sensors, or complementary metal-oxide semiconductor (CMOS) sensors can be used to generate the optical grating image. The resolution of the height measurement can be limited by the pixel size of the camera, and new solutions for improving the resolution are strived for.

SUMMARY

Disclosed herein are implementations of methods, apparatuses, and systems for measuring a height of a sample.

In an aspect, a method for measuring a height of a sample is disclosed. The method includes receiving, by an optical sensor having pixels, an optical grating image of an illuminated optical grating reflected by a surface of the sample, determining, by a processor, a digital grating image by keeping values of first pixels of the optical grating image and resetting values of second pixels of the optical grating image, and determining the height based on a relationship between an integrated intensity of a portion of the digital grating image and the height.

In another aspect, an apparatus for measuring a height of a sample is disclosed. The apparatus includes a processor and a memory. The memory is coupled to the processor and configured to store instructions which when executed by the processor become operational with the processor to receive, by the optical sensor, an optical grating image of an illuminated optical grating reflected by a surface of the sample, determine a digital grating image by keeping values of first pixels of the optical grating image and resetting values of second pixels of the optical grating image, and determine the height based on a relationship between an integrated intensity of a portion of the digital grating image and the height.

In another aspect, a non-transitory computer-readable medium for measuring a height of a sample is disclosed. The non-transitory computer-readable medium includes instructions which when executed by a processor become operational with the processor to receive, by an optical sensor having pixels, an optical grating image of an illuminated optical grating reflected by a surface of the sample, determine a first digital grating image by keeping values of first pixels of the optical grating image and resetting values of second pixels of the optical grating image, and a second digital grating image by resetting the values of the first pixels and keeping the values of the second pixels, and determine the height based on a relationship between the height and integrated intensities at portions of the first and second digital grating images.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
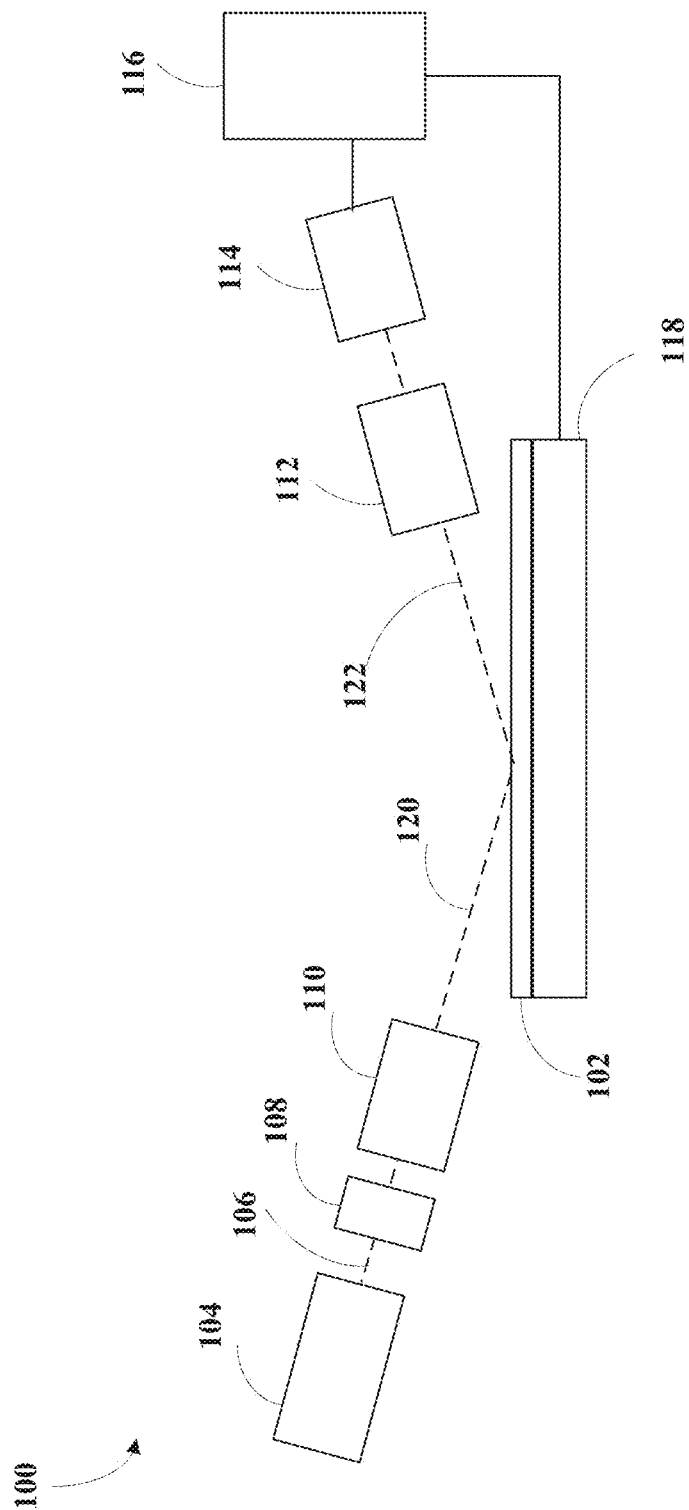
FIG. 1 is a block diagram of an example system for measuring a sample height according to implementations of this disclosure.

With the fast development of microelectronics, the technology node of integrated circuits is shrinking down to a nanometer degree. Charged particle (e.g., electron) beams have been used in semiconductor field as an inspection technology that can provide measurement accuracy to a nanometer (nm) degree.

During inspection or measurement, a wafer (or "sample") under inspection is expected to be at the best focus plane to achieve fast throughput and high measurement accuracy. For example, the wafer can be placed on the best focus plane by adjusting an electron lens current or a stage carrying the sample in the Z direction. For the stage adjustment, a measurement apparatus can be used to continuously measure a height of the wafer surface. The measured height can be used in the feedback control for adjusting the stage to the reference plane (e.g., in the Z direction).

Typically, the measurement apparatus can use an optical grating (e.g., including multiple optical grating lines) as a projecting object. The measurement apparatus can image the optical grating onto the sample surface, which can be reflected by the sample surface to be received by an optical sensor, such as a CCD sensor or a CMOS sensor. The optical sensor can generate an image of the optical grating (referred to as an "optical grating image"). When the sample height changes, the optical grating image can correspondingly shift on the optical sensor. The sample height can be determined based on a relationship between the displacement of the optical grating image on the optical sensor and the sample height. However, the measurement resolution can be limited by the pixel size of the optical sensor (e.g., ¼-pixel size).

Methods, apparatuses, and systems for height measurement based on digital grating are provided according to implementations of this disclosure. The disclosed methods and apparatuses can generate a virtual or non-physical grating using a pixelized optical sensor (referred to as a "digital grating"). The digital grating can be configured to keep and reset (or clear) selected pixels of the optical grating image. Digital grating images can be generated by overlapping the digital grating and the optical grating image. When the sample height changes, the digital grating images can also change correspondingly. Integrated light intensities (or "integrated intensities") of the digital grating images can be determined and used for measuring the sample height. The term "integrated intensity" herein refers to a total optical intensity (e.g., determined as a sum or an integral) of light shed into a region. The disclosed methods, apparatuses, and systems herein can be referred to as an "optical vernier caliper" as an analogy to a mechanical vernier caliper.

A mechanical vernier caliper includes a main scale and a vernier scale. The main and vernier scales have a difference in spacing, which determines the measurement resolution. In this disclosure, the digital grating can have a first duty cycle (e.g., 1:1) with a first space period (or simply "period" hereinafter). The optical grating can have a second duty cycle (e.g., 1:1) with a second period. In some implementations, the first and second duty cycles can be the same. The digital gratings can function as the "main scale," and the optical grating image can function as the "vernier scale." In some implementations, if the first and second duty cycle is 1:1, the difference between the first and second periods (referred to as Δp) can determine the measurement resolution of the optical vernier caliper. By measuring integrated intensities of the optical grating image, the height of the sample surface can be measured.

In some implementations, the measurement resolution can be further improved by fitting a normalized integrated intensity differential curve determined from the optical grating image. By using the optical vernier caliper, the measurement resolution can depend on Δp and a fitted normalized integrated intensity differential curve. The measurement resolution can achieve as high as tiny fractions of pixels (e.g., 1/40 pixel). Further, the imaging process is simplified and accelerated for higher measurement speed. Also, the shape or size of the digital gratings can be digitally changed for measurement flexibility. By fitting the normalized integrated intensity differential curve, the sample height can be obtained with reduced sensitivity to the light intensity variation due to the sample surface patterns.

It should be noted that the "sample" herein refers to any physical object having a specular or mirror-like surface. For example, the sample can include a silicon wafer, a mirror, or a glass product. The application of the optical vernier caliper is not limited to wafer height measurement in semiconductor manufacturing. It can be used for measuring the height, translation, or displacement of any object with reflective surfaces.

FIG. 1 is a block diagram of an example system 100 for measuring a sample height according to implementations of this disclosure. The system 100 includes an illumination device 104, an optical grating 108, a first optical device 110, a second optical device 112, an optical sensor 114, a computing device 116, and a height adjuster 118.

The illumination device 104 is configured to generate an illumination 106. The illumination device 104 can include a light source and an illumination optical system. The light source can be a light-emitting diode (LED), a laser, or any light source emitting light detectable by the optical sensor 114. The illumination optical system can be used to change the light propagation direction to illuminate the optical grating 108.

The optical grating 108 can include multiple slits and spacing. The slits can have a duty cycle with a period. In one implementation, the optical grating 108 can include at least one slit substantially parallel to a surface of a sample 102. The optical grating 108 can include various patterns, such as a rectangular pattern or a crossed pattern.

The duty cycle of a grating can be determined as the ratio of the width of the slit to the width of the spacing in a period. For example, the duty cycle of the optical grating 108 can be 1:1, which means the width of the slit and the width of the spacing is 1:1.

The first optical device 110 is configured to receive the illumination 106 and to image the optical grating 108 to the surface of the sample 102 through a projection light 120. The first optical device 110 can be arranged in the light path of the projection light 120. The first optical device 110 can include one or more lenses. In one implementation, the first optical device 110 can include a telecentric lens for telecentrically imaging the optical grating 108 to the sample 102. The projection light 120 can be reflected by the sample surface to become detection light 122.

The second optical device 112 can be arranged in the light path of the detection light 122. The second optical device 112 can receive, focus and project the detection light 122 onto the optical sensor 114. The second optical device 112 can include one or more lenses. In one implementation, the second optical device 112 can include a telecentric lens for telecentrically projecting the detection light 122 to the optical sensor 114. It should be noted that the first optical device 110 and the second optical device 112 can include other forms of lenses suitable for projecting and manipulating light.

The optical sensor 114 can include multiple pixels. The optical sensor 114 can be, for example, a CCD sensor, a CMOS sensor, or any type of optical sensors. Pixels of the image generated by the optical sensor 114 can be selectively kept or reset (or cleared), the process of which can be referred to as "filtering." The term "keep" herein refers to keeping an object unchanged, such as a value of a pixel. The term "reset" herein refers to changing a value of an object to be another value, such as 0. The kept pixels can be labeled as "1," and the reset pixels can be labeled as "0." The filtering can be done on software level (e.g., by codes or instructions executed by the computing device 116). For example, values of some pixels of the image are kept (e.g., multiplied by 1), and values of some pixels of the image are cleared (e.g., multiplied by 0). The filtering can also be done on the hardware level. For example, some pixels of the optical sensor 114 can be activated (e.g., configured to output a signal), and some pixels of the optical sensor 114 can be deactivated (e.g., configured to output no signal). The labeled pixels (e.g., the image pixels or the sensor pixels) can form a matrix of "1" and "0", which can be referred to as a "digital grating." In other words, the digital grating can be implemented as a matrix (referred to as a "grating matrix") that includes values (e.g., "1" and "0") representing labels associated with pixels of the optical sensor, in which the labels indicate whether values of the pixels are used (e.g., kept or reset) for later processing.

In some implementations, the digital grating can be varied or modulated. For example, values of some pixels can be weighted (e.g., multiplied by −1.5, 0.5, 2, or any number). For another example, values of some pixels can be modulated with a phase (e.g., multiplied by a complex number). For ease of explanation without causing ambiguity, the software-level filtering is described as an example hereinafter.

The computing device 116 is configured to generate digital gratings and digital grating images. The digital grating images can be generated by overlapping the optical grating image with one or more digital gratings. Such overlapping can be realized by multiplying a matrix representing the intensity of the optical grating image (referred to as an "intensity matrix") and the grating matrix. Components of the computing device 116 will be detailed in FIG. 2.

The height adjuster 118 is configured to control the sample height. The height adjuster 118 can attach to a holder (not shown) configured to hold the sample 102. The height adjuster 118 can receive signals or commands from the computing device 116 to control the sample height. For example, the height adjuster 118 can be a Z stage that moves the sample 102 vertically. The term "receive" used herein can refer to receiving, inputting, acquiring, retrieving, obtaining, reading, accessing, collecting, or any action in any manner for inputting information or data.

In some implementations, when the height adjuster 118 moves h with respect to a reference height (e.g., the zero height), the optical grating image can move x with respect to a corresponding reference position on the optical sensor 114. For example, the relationship between h and x can be $$h=fx \qquad \text{Eq. (1)}$$

where f is a scaling factor. In some implementations, f can be determined based on geometric parameters (e.g., an angle between the detection light 122 and the surface of the sample 102) and/or optical parameters (e.g., the magnification of the second optical device 112).

Figure 2:
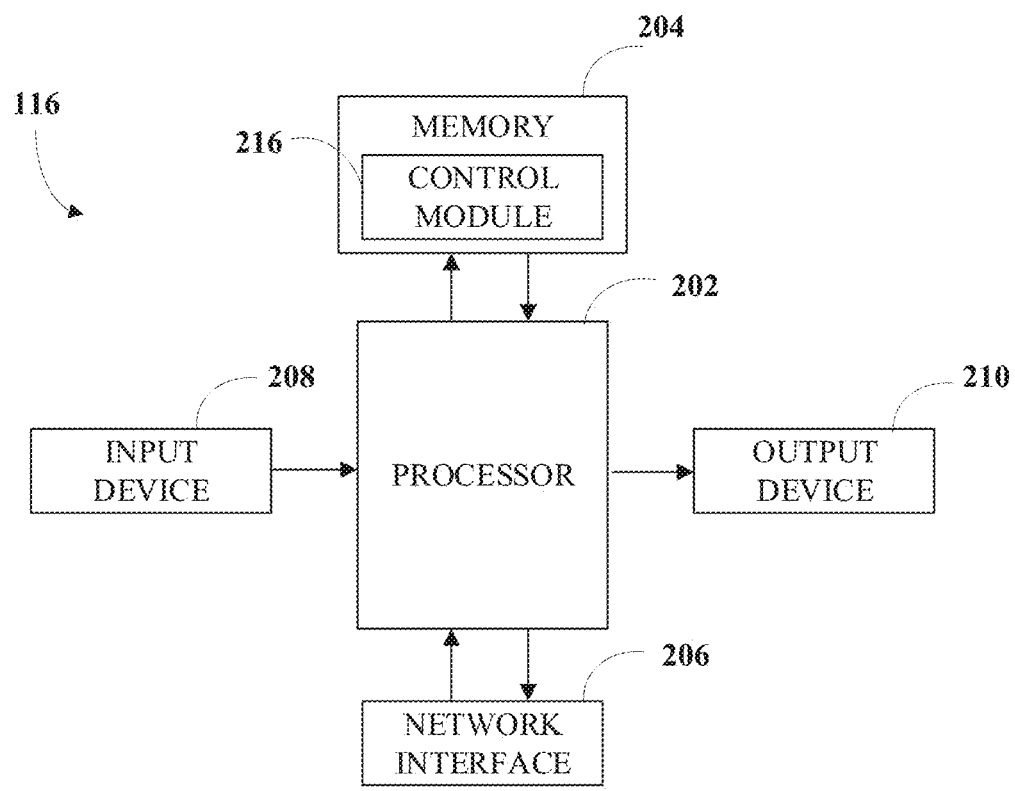
FIG. 2 is a block diagram of an example apparatus for measuring the sample height according to implementations of this disclosure.

FIG. 2 is a block diagram of the computing device 116 for measuring the sample height according to implementations of this disclosure. The computing device 116 can include a processor 202, a memory 204 (e.g., RAM or a non-transitory storage medium), a network interface 206, an input device 208, and an output device 210. For example, the processor 202 can include a central processing unit (CPU) and/or a graphical processing unit (GPU).

The memory 204 can be implemented as Random Access Memory (RAM), or any suitable storage device, or another type of device capable of storing instructions and data accessible by the processor 202. The memory 204 can include a control module 216. The control module 216 can be hardware or software modules, such as integrated circuits, chips, or computer-readable instructions. The processor can access and communicate with the control module 216 via the memory 204. In some implementations, the control module 216 can include a driver (e.g., a software driver) for driving the stage to move.

For example, the memory 204 can include codes or instructions for generating the digital grating (e.g., the grating matrix) and digital grating image. The digital grating image can be generated by multiplying the intensity matrix and the grating matrix. The memory 204 can also include codes or instructions for processing the digital grating images, such as computing integrated intensities. The memory 204 can include codes or instructions for analyzing the digital grating image to determine the sample height. The memory 24 can further include codes or instructions for adjusting the sample height. For example, in iterative operations, a currently measured sample height can be compared with a previously measured sample height, and the comparison results can be inputted into a feedback control loop for determining a moving direction and/or a value of the Z stage. The moving direction and/or value can be transformed as a control signal (e.g., a voltage) in digital or analog format.

The network interface 206 can be used to send and receive data or signals for communications with other devices. For example, the network interface 206 can be connected to the optical sensor 114 to receive the data of the optical grating image, and send it to the processor 202 for processing. For example, the network interface 206 can be connected to the height adjuster 118 to receive signals from the processor 202 to control the sample height. In another example, instructions for remote control of the computing device 116 or other computing devices can be received in the network via a designated medium, such as a data bus or an Ethernet link.

The input device 208 can input signals to the processor 202 for processing. For example, the input device 208 can include an interface (e.g., a Universal Serial Bus) to receive signals from the optical sensor 114. In addition, the input device 208 can further include a keyboard or a touchscreen, which enables a user to enter commands to the computing device 116. For example, commands or parameters can be entered from the input device 208 for generating the digital grating and the digital grating image. Parameters or control instructions received by the input device 208 can be loaded into the memory 204 (e.g., stored in the control module 216).

The output device 210 can output the control signal to the height adjuster 118. For example, the output device 210 can output a digital control signal (e.g., a control voltage) for controlling the height adjuster 118. The digital control signal can be outputted to a digital-to-analog converter (DAC) to be converted to an analog control signal. The analog control signal can be inputted to the driver of the height adjuster 118 for driving the same. In addition, the output device 210 can further include a display screen that can be used for displaying information related to the measurement of the sample height. The output device 210 can enable a user, such as a process engineer, to monitor the current status of the measurement of the sample height.

The computing device 116 can further include additional devices for the measurement of the sample height. The computing device 116 can also include multiple devices, such as multiple input devices.

Figure 3:
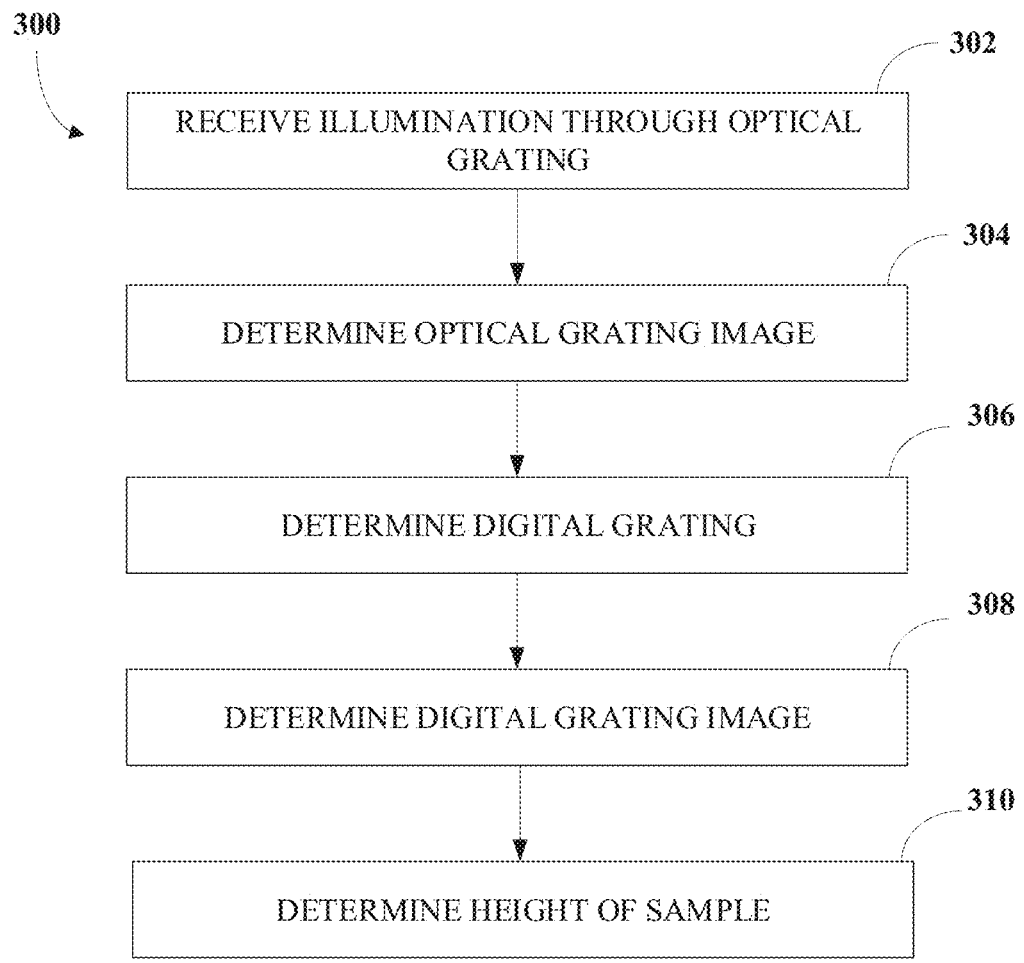
FIG. 3 is a flowchart of an example process for measuring the sample height according to implementations of this disclosure.

FIG. 3 is an example process 300 for measuring the sample height according to implementations of this disclosure. The process 300 can be performed by hardware (e.g., chips) or software (e.g., instructions or codes executable by a processor), such as by the computing device 116. In the following descriptions, the process 300 will be described in connection with FIGS. 4-12.

At operation 302, an illumination is received by the optical grating 108. For example, the illumination can be generated by the illumination device 104, and the optical grating can be the optical grating 108 in FIG. 1.

At operation 304, an optical grating image is determined. For example, the illumination can image the optical grating on or near the surface of a sample, which can be reflected (e.g., specular-reflected) by the same. The reflected light can be projected and/or focused by the second optical device 112 to be received by the optical sensor 114. The optical grating image can be generated by the optical sensor 114.

Figure 5:
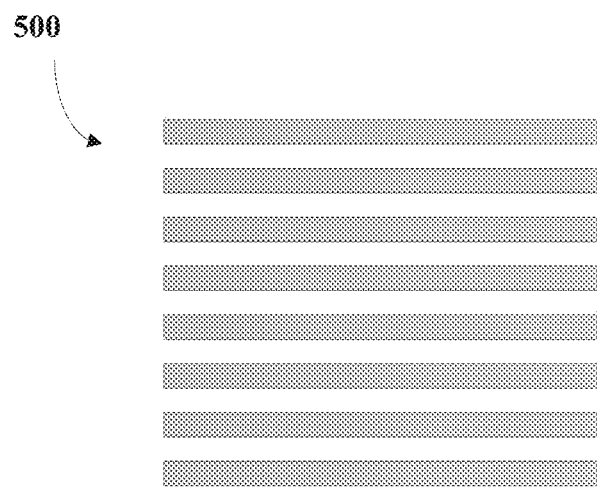
FIG. 5 is an example optical grating image in some implementations of this disclosure.

FIG. 5 is an example optical grating image 500. The illumination can pass through the slits of the optical grating and form a pattern shown as gray areas spaced by white areas in FIG. 5. In this disclosure, neighboring pixels in the optical grating image representing areas not illuminated by the passed light can be referred to as an "optical grating line." For example, the optical grating image 500 includes 8 optical grating lines (in gray color). The pattern of the optical grating image 500 can be similar to the pattern of the optical grating 108. The period of the optical grating can be p, and the duty cycle can be 1:1. When the duty cycle of the optical grating is 1:1, the width of the gray area is equal to the width of the white area in the optical grating image 500. In other implementations, the optical grating image can include other patterns, or have duty cycles other than 1:1.

Referring back to FIG. 3, at operation 306, a digital grating is determined. For example, the digital grating can be generated by the image processing software in the computing device 116. To improve height measurement precision, more than one digital gratings can be generated. For ease of explanation without causing ambiguity, examples of using two digital gratings (referred to as a "first digital grating" and a "second digital grating") are described hereinafter. The digital gratings can be implemented at software or hardware level. For example, the software-level digital gratings can be the grating matrix. In the software level, any characteristics of the digital gratings can be constructed with ease.

In some implementations, the first and second digital gratings can be constructed as complementary. The term "complementary" herein refers to: pixels labeled as "1" and "0" in the first digital grating are labeled in the second digital grating as "0" and "1", respectively. If the first and second digital gratings are complementary, they can have the same duty cycle and period. To measure the sample height, the patterns of the two digital gratings can be similar to the pattern of the optical grating image, such as having a duty cycle of 1:1. To achieve different purposes, the period of the two digital gratings can be set as slightly different from or the same as the period of the optical grating image, which will be described later.

Figure 6:
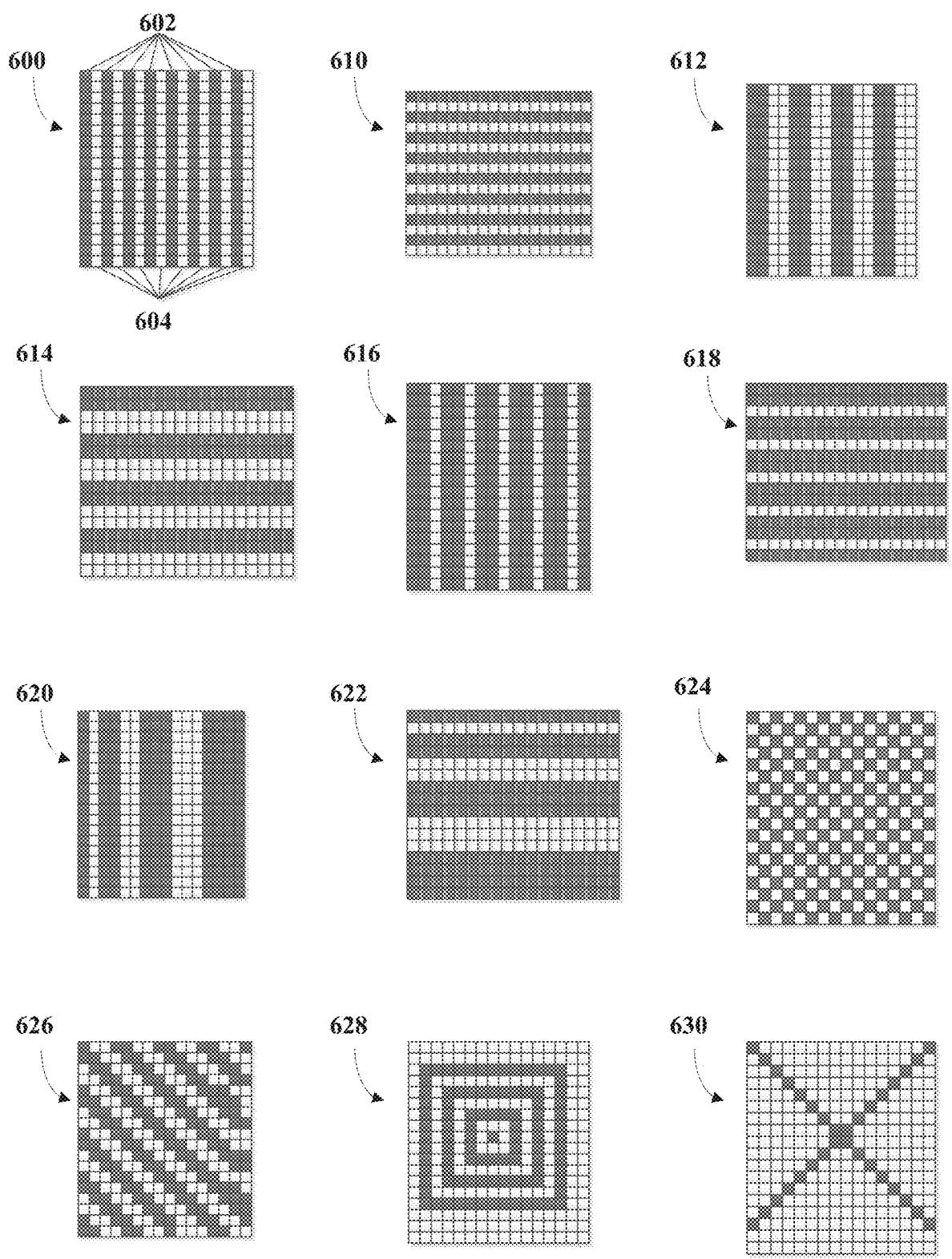
FIG. 6 is example digital gratings in some implementations of this disclosure.

FIG. 6 shows example digital grating sets 600-630 that can be used in implementations of this disclosure. In FIG. 6, each of the digital grating sets 600-630 includes two complementary digital gratings. Each of the digital grating sets 600-630 can include multiple pixels, and a pixel is represented by a rectangular block in gray or white color. The colors of the pixels can represent different labels for a digital grating. For example, for the first digital grating of the digital grating set 600, pixels 602 (in gray color) can be labeled as "1" and pixels 604 (in white color) can be labeled as "0." For the second digital grating of the digital grating set 600, the pixels 602 can be labeled as "0" and the pixels 604 can be labeled as "1." In this disclosure, neighboring pixels labeled as "1" are referred to as a digital grating line, and pixels labeled as "0" form the space in the digital gratings. The duty cycle of the digital grating can be a ratio of the width of a digital grating line to the width of its neighboring space. The period of the digital grating can be a repeatable space pattern that includes a digital grating line and its neighboring space.

As shown in FIG. 6, the patterns of the digital grating sets 600-630 can have different configurations, such as different sizes, orientations, or shapes. The digital grating sets 600 and 610 show that the digital grating lines can have different orientations, such as horizontal and vertical. The digital grating sets 612 and 614 show that the digital grating lines can have a larger size, such as a width of two pixels. The digital grating sets 616 and 618 show that the digital gratings can have the same period and varied duty cycles, such as 1:2 (when the gray and white pixels are labeled as "0" and "1," respectively) or 2:1 (when the gray and white pixels are labeled as "1" and "0," respectively). The digital grating sets 620 and 622 show that the digital gratings can have varied periods and the same duty cycle, such as 1:1. The digital grating sets 624 and 626 show that the digital grating lines can be tilted, such as diagonal. The digital grating sets 628 and 630 show that the digital grating lines can form various patterns, such as a rectangular pattern in the digital grating sets 628, or a cross-shaped pattern in the digital grating sets 630.

The period and the duty cycle of the digital gratings can be any number. For example, in FIG. 6, the digital grating sets 600-618 have constant periods in horizontal or vertical directions, the digital grating sets 620 and 622 have varied periods, the digital grating sets 624 and 626 have constant periods in a tilted direction, and the digital grating sets 628 and 630 have irregular periods. In FIG. 6, the digital grating sets 600-614 have a duty cycle of 1:1; the digital grating sets 616-618 have a duty cycle of 2:1 or 1:2; the digital grating sets 620 and 622 have a duty cycle of 1:1 but with varying periods; and the digital grating sets 628 and 630 have irregular duty cycles.

Figure 7:
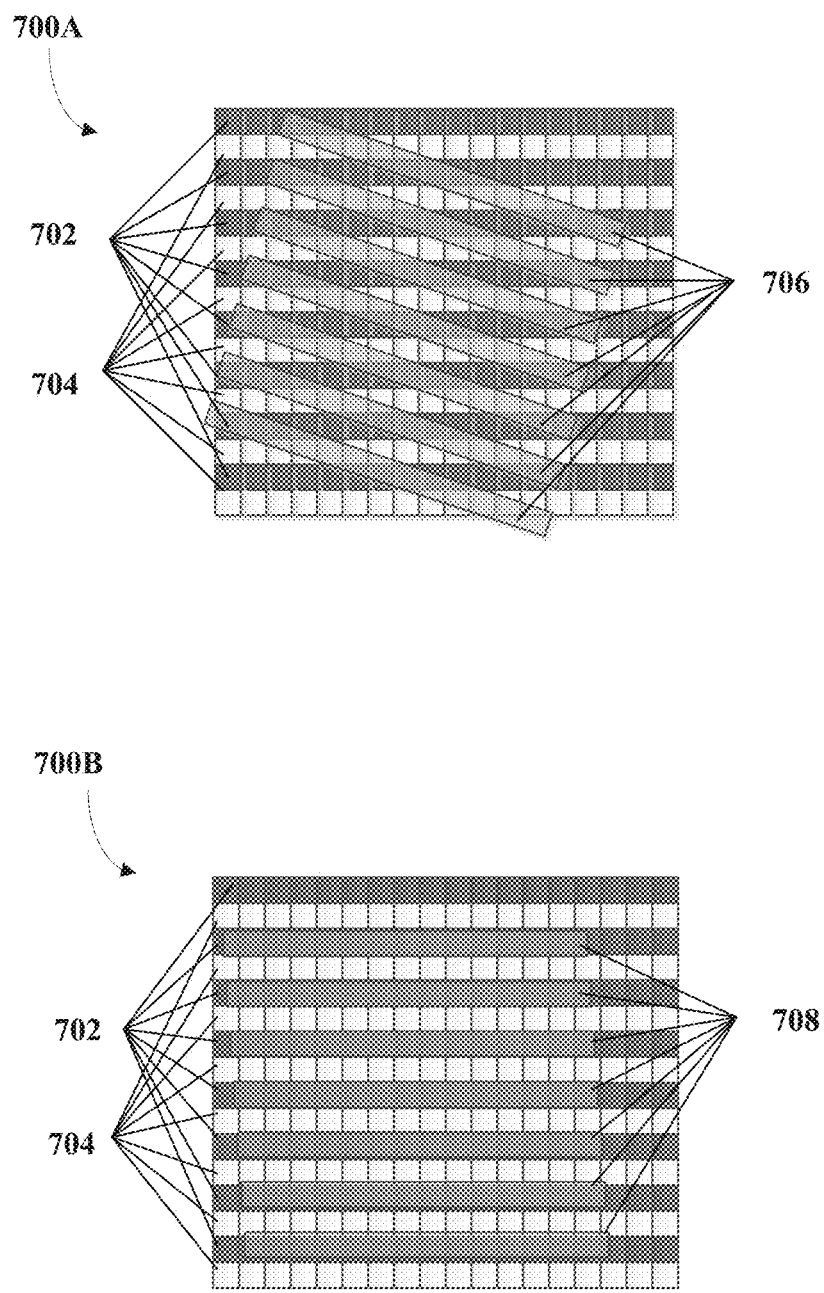
FIG. 7 is a diagram of adjusting alignment between an example optical grating image and example digital gratings in some implementations of this disclosure.

In some implementations, the alignment between the optical grating image and the digital gratings can be adjusted to reduce measurement errors. FIG. 7 is an example diagram of adjusting the alignment by rotation. As shown in diagram 700A, the optical grating lines of the optical grating image 706 obliquely cross the digital grating lines of two complementary digital gratings. The first digital grating can include first pixels 702 (in gray color) labeled as "1" and second pixels 704 (in white color) labeled as "0," and the second digital grating can include the first pixels 702 labeled as "0" and the second pixels 704 labeled as "1." To adjust the alignment, the optical grating image 706 or the digital gratings can be rotated (e.g., by the computing device 116) to meet a measurement requirement. For example, the measurement requirement can be that a digital grating line is parallel to an optical grating line. After the adjustment, the digital gratings and the optical grating image 708 are parallel, as shown in diagram 700B.

Figure 8:
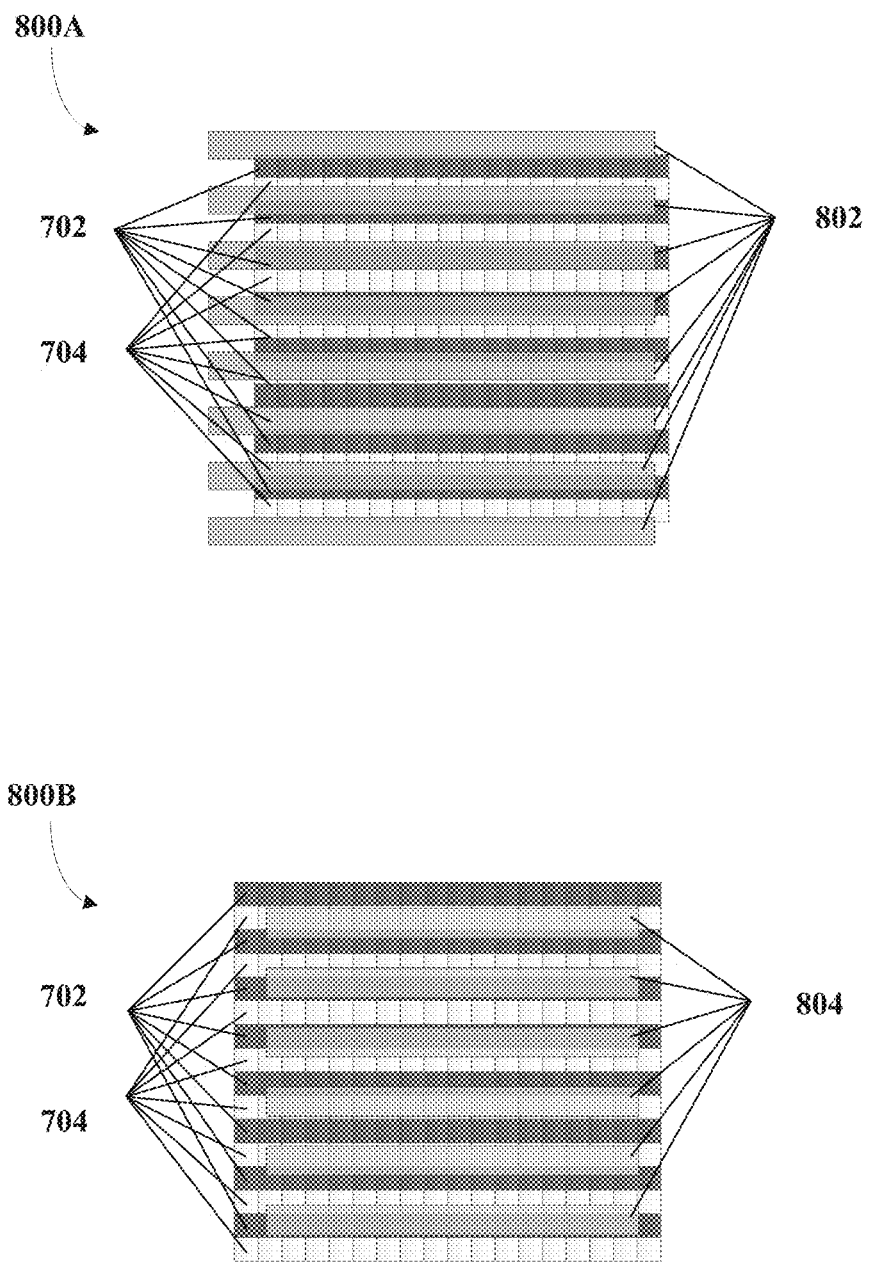
FIG. 8 is another diagram of adjusting alignment between an example optical grating image and example digital gratings in some implementations of this disclosure.

FIG. 8 is another example diagram for measuring the alignment by adjusting the size of the optical grating image. In diagram 800A, the size of the optical grating image 802 is larger than the digital gratings. To adjust the alignment, the optical grating image 802 can be resized using a zoom lens. For example, by adjusting the lenses of the first optical device 110 or the second optical device 112, the optical grating image 802 can be adjusted to different sizes to meet a measurement requirement. As shown in diagram 800B, after the adjusting, the optical grating image 804 is resized to be smaller than the optical grating image 802. Different patterns of digital gratings can also be applied to meet different measurement requirements.

Referring back to FIG. 3, at operation 308, a digital grating image is determined. When multiple digital gratings (e.g., the two complementary digital gratings) are generated at the operation 306, a corresponding digital grating image can be generated for each of the multiple digital gratings. For multiple digital gratings, a digital grating image can be generated for each of the multiple digital gratings.

Figure 9:
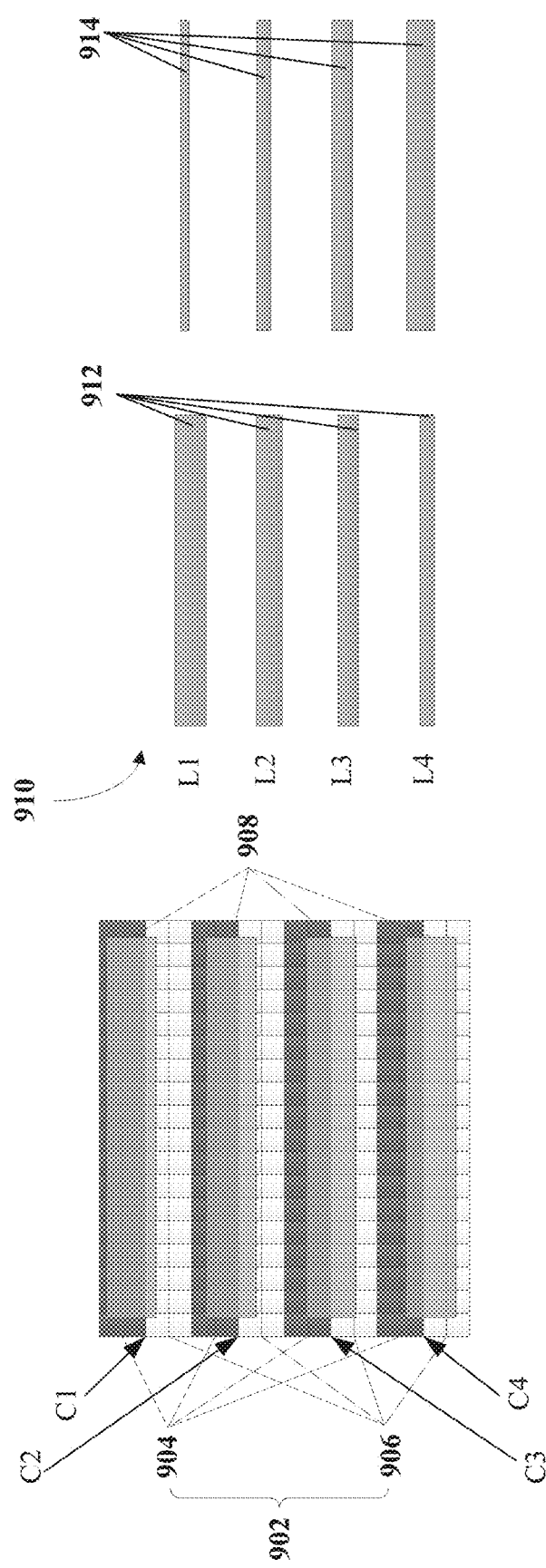
FIG. 9 is a diagram of example digital grating images in some implementations of this disclosure.

FIG. 9 shows an example digital grating image set 910 including a first digital grating image 912 and a second digital grating image 914. The digital grating set 902 includes two complementary digital gratings. The first digital grating includes pixels 904 (in gray color) labeled as "1" and pixels 906 (in white color) labeled as "0." The second digital grating includes the pixels 904 labeled as "0" and the pixels 906 labeled as "1." In other words, the pixels 904 and 906 form digital grating lines in the first and second digital gratings, respectively. In FIG. 9, each of the two complementary digital gratings includes four digital grating lines. The boundaries of the digital grating lines with same grating line number between the first and second digital gratings are marked as C1-C4. For example, C1 is the boundary between the first grating line of the first digital grating and the first grating line of the second digital grating. C2 is the boundary between the second grating line of the first digital grating and the second grating line of the second digital grating, and so on.

The first and second digital gratings have a duty cycle of 1:1 and a period of p. The period p is a space period that can be represented by a number of pixels (e.g., 4 pixels in FIG. 9) times a physical size of the pixel (e.g., 1 micrometer). The optical grating image 908 has a duty cycle of 1:1 and a period of $p+\Delta p$. The value of $\Delta p$ can be positive or negative.

The first and second digital grating images 912 and 914 can be obtained by overlapping the optical grating image 908 with the first and second digital gratings, respectively. For example, the first digital grating image 912 can be generated by multiplying the intensity matrix of the optical grating image 908 and the grating matrix of the first digital grating. After the multiplication, intensity values of the optical grating image 908 overlapping with the pixels 904 remain (represented as rectangular gray areas in the first digital grating image 912), while intensity values of the optical grating image 908 overlapping with the pixels 906 are cleared (e.g., set as 0). The second digital grating image 914 can be obtained in a similar fashion, in which intensity values of the optical grating image 908 overlapping with the pixels 906 remain (represented as rectangular gray areas in the second digital grating image 914), while intensity values of the optical grating image 908 overlapping with the pixels 904 are cleared (represented by white space). The boundaries of the digital grating lines of the two complementary digital gratings can form positions for measuring the sample height. For example, the digital grating set 902 includes four such boundaries C1-C4.

Referring back to FIG. 3, at operation 310, the sample height is determined based on the digital grating images. Details of the sample height measuring will be set forth in descriptions as follows.

Figure 4:
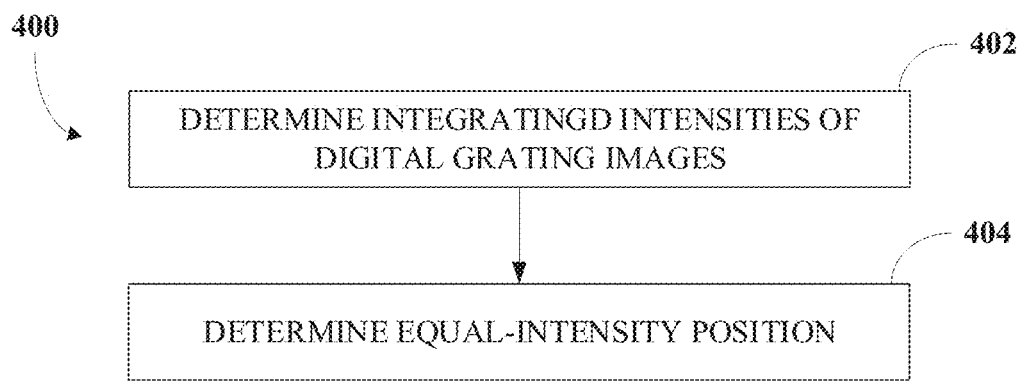
FIG. 4 is another example process for measuring the sample height according to implementations of this disclosure.

FIG. 4 is an example process 400 for measuring the sample height using one or more digital grating images. The process 400 can be implemented as a process between the operations 308 and 310. For example, the one or more digital grating images can include two complementary digital gratings (e.g., the first and second digital grating images 912 and 914 in FIG. 9). In an implementation, the process 400 can be implemented using only one digital grating and digital grating image. To reduce the dependence of measurement reference positions on the integrated intensity and decrease the impact of the integrated intensity on the measurement accuracy, two complementary digital gratings can be used and will be described as examples hereinafter. It should be noted that the optical vernier caliper disclosed herein can use one or more digital gratings, not limited to the two complementary digital gratings.

At operation 402, integrated intensities are determined for digital grating images of the two complementary digital gratings. For example, as shown in FIG. 9, the optical intensity in each digital grating line of the digital grating set 902 can be computed, and the integrated intensity of a digital grating image can be determined as a sum of the intensities on pixels of each digital grating line in the corresponding digital grating. For example, in FIG. 9, the digital lines of the first and second digital grating include the pixels 904 and 906, respectively. Correspondingly, each of the first and second digital grating images 912 and 914 includes four lines of kept pixels (shown as gray rectangles). In other words, each of the first and second digital grating images includes four optical grating lines that are marked as L1-L4 in FIG. 9. The integrated intensities in L1-L4 of the first digital grating image 912 can be determined as $I_{11}$, $I_{12}$, $I_{13}$, and $I_{14}$, respectively. The integrated intensities in L1-L4 of the second digital grating image 914 can be determined as $I_{21}$, $I_{22}$, $I_{23}$, and $I_{24}$, respectively.

Figure 10A:
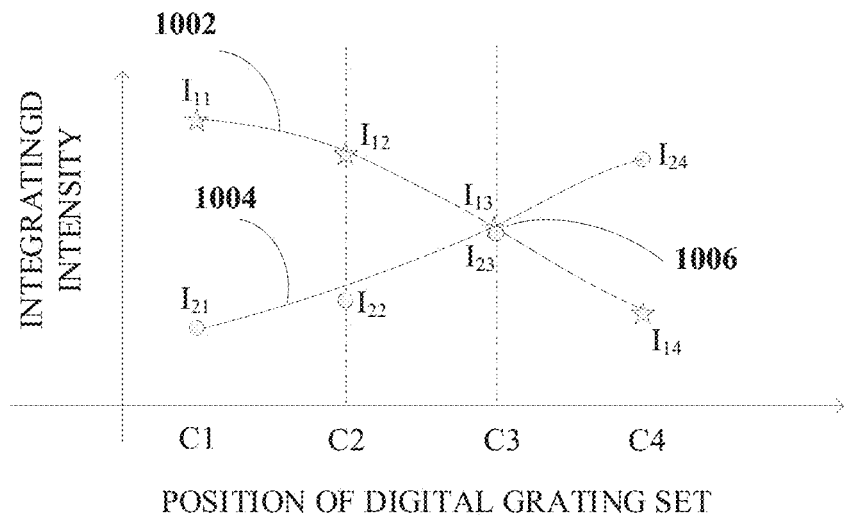
FIGS. 10A-10D are example graphs showing integrated signal curves in some implementations of this disclosure.
Figure 10B:
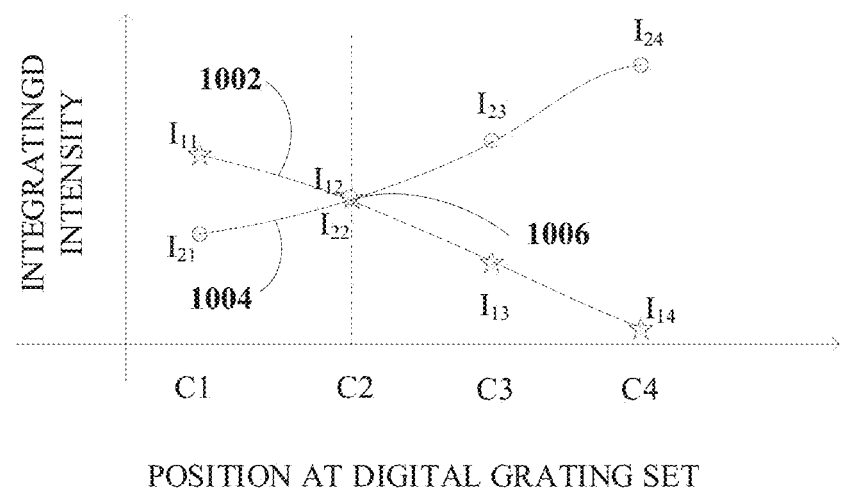

FIGS. 10A-10B are graphs showing the integrated intensities of the optical grating lines L1-L4 measured at the boundaries C1-C4. The vertical axis of the FIGS. 10A-10B represents the integrated intensity. The horizontal axis of FIGS. 10A-10B represents positions of the digital gratings, including boundaries C1-C4. The integrated intensities determined in L1-L4 of the two complementary digital gratings are positioned in FIGS. 10A-10B at corresponding boundaries. For example, $I_{11}$ and $I_{21}$ are positioned at C1, which is the boundary of L1 for the two digital gratings. Two integrated intensity curves 1002 and 1004 can be determined by connecting the integrated intensities for each digital grating. In some implementations, the integrated intensity curves 1002 and 1004 can be determined by fitting (e.g., a polynomial fitting or a trigonometry fitting).

Referring back to FIG. 4, at operation 404, an equal-intensity position between the integrated intensity curves 1002 and 1004 is determined. For example, a cross point 1006 can be determined in FIG. 10A, and the x-coordinate of the cross point 1006 can correspond to a position in the digital grating set 902, which can be referred to as the "equal-intensity position." In FIG. 10A, as an example, the equal-intensity position is the boundary C3. In other words, the integrated intensities of the first and second digital grating images 912 and 914 are equal at the optical grating line L3. That is, the boundary C3 equally divides the boundary-crossing optical grating line L3 into two parts. One part is in the third grating line (the third gray grating line of the pixels 904 from top to bottom in FIG. 9) of the first digital grating and has an integrated intensity $I_{13}$, and the other part is in the third grating line (the third white grating line of the pixels 906 from top to bottom in FIG. 9) of the second digital grating and has an integrated intensity $I_{23}$. The equal-intensity position can be used as a reference position for height measurement, which will be described as follows.

Based on the equal-intensity position, the sample height can be determined at the operation 310. For example, when the optical grating image 908 moves down by Δp, the integrated intensities of L2 of the first and second digital grating images 912 and 914 become equal. In other words, the cross point 1006 can shift by one period p of the digital gratings as shown in FIG. 10B. That is, in FIG. 10B, the equal-intensity position shifts from C3 to C2. Compared with FIG. 10A, because the integrated intensities of L1-L4 changes as the optical grating image 908 moves, the integrated intensity curves 1002 and 1004 are changed correspondingly in FIG. 10B. For another example, when the optical grating image 908 moves down by 2Δ, the equal-intensity position shifts from C3 to C1. In other words, a relationship exists between the displacement (e.g., 2Δp) of the optical grating image and the number of periods (e.g., 2) for which the equal-intensity position changes. Generally, assuming the equal-intensity position changes from a reference position for d periods, the corresponding displacement x of the optical grating image on the optical sensor can be determined as $$x = \Delta p \cdot d \quad \text{Eq. (2)}$$

When the equal-intensity position is at the reference position, the sample height can be set as 0. In some implementations, the reference position can be predetermined (e.g., designed, assigned, or calibrated). By measuring d and using Eqs. (1) and (2), the sample height can be determined.

In some implementations, Δp can be selected as a small value, such as a fraction (e.g., ½, ¼, 1/10, 1/30, 1/40, etc.) of p. That is, Δp can be smaller than or equal to one half of p. When the optical grating image moves up and down on the digital gratings (e.g., as shown in FIGS. 10A-10B), the measurement process can be similar to a mechanical vernier caliper: the digital grating set can function as the main scale having a spacing p, and the moving optical grating image can function as the vernier scale having a spacing (p+Δp). The process of finding the equal-intensity position can be analogized to the process of finding the aligned scale between the main scale and the vernier scale of the mechanical vernier caliper. That is why the disclosed methods, apparatuses, and systems can be referred to as an "optical vernier caliper." As can be seen from Eq. (2), the measurement resolution of the optical vernier caliper depends on Δp.

FIGS. 10A-10B describes an example when the equal-intensity position is at a boundary between the digital grating lines of the two complementary digital gratings. In more general scenarios, the equal-intensity position can be at a position off the boundaries.

Figures 10C, 10D:
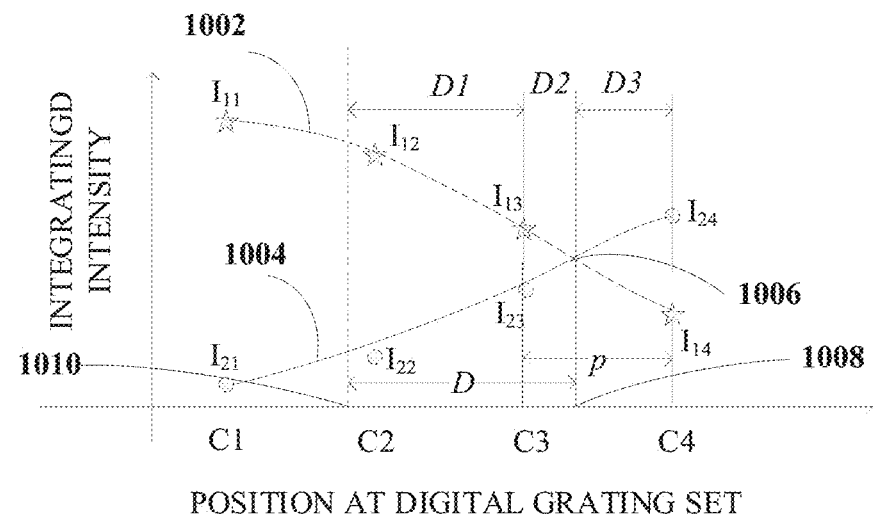
Figure 11:
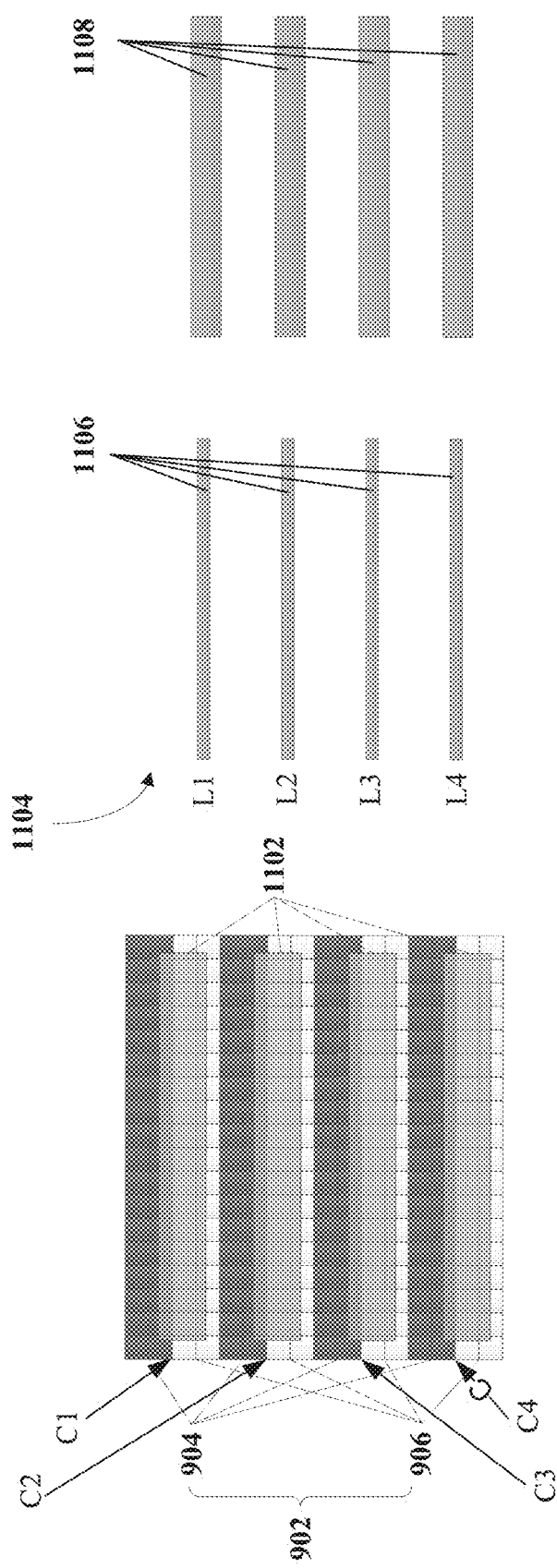
FIG. 11 is a diagram of other example digital grating images in some implementations of this disclosure.

FIG. 10C is a graph showing the integrated intensities of the optical grating lines when the equal-intensity position is not at a boundary of the digital grating lines. In FIG. 10C, the cross point 1006 corresponds to an equal-intensity position 1008, which is between the boundaries C3 and C4. A reference position 1010 is between the boundaries C1 and C2. In other words, when the equal-intensity position is at the reference position 1010, the sample height is 0. In some implementations, the sample height can be determined as follows.

As shown in FIG. 10C, the distance between the equal-intensity position 1008 and the reference position 1010 is D. The distance between the boundary C3 and the reference position 1010 is D1. The distance between the boundary C3 and the equal-intensity position 1008 is D2. The distance between the boundary C4 and the equal-intensity position 1008 is D3. The period of the digital gratings is p. It can be seen that $$p = D2 + D3 \quad \text{Eq. (3)}$$

Based on the integrated intensities $I_{13}$, $I_{14}$, $I_{23}$, and $I_{24}$, the relationship between D2 and D3 can be nearly linearly determined as:

$$\frac{I_{24} - I_{14}}{I_{13} - I_{23}} = \frac{D3}{D2} = \frac{p - D2}{D2} = \frac{p}{D2} - 1 \quad \text{Eq. (4)}$$

Based on the relationship between D2 and D3, D2 can be determined as:

$$D2 = \frac{p \times (I_{13} - I_{23})}{(I_{24} - I_{14}) + (I_{13} - I_{23})} \quad \text{Eq. (5)}$$

Based on the D1 and D2, the distance D can be determined as:

$$D = D1 + D2 \quad \text{Eq. (6)}$$

When D is determined, the number of periods d can be determined as D/p. By using Eqs. (1) and (2), the sample height can be determined.

In some implementations, the precision of the integrated intensity measurement can be affected by various factors, such as surface patterns of the sample or unbalanced illumination light. To further reduce the dependency of the height measurement precision on the integrated intensity, the integrated intensities of the two complementary digital gratings can be normalized before determining the equal-intensity position. For example, if the integrated intensity of an optical grating line of the first and second digital grating images are $I_1$ and $I_2$, respectively, a normalized integrated intensity differential I can be determined as:

$$I = \frac{I_1 - I_2}{I_1 + I_2} \quad \text{Eq. (7)}$$

FIG. 10D is a graph showing the normalized integrated intensity differential I for L1-L4. (i=1, 2, 3, 4) can be determined using Eq. (7) from $I_{1i}$ and $I_{2i}$ (i=1, 2, 3, 4) in FIG. 10C. The equal-intensity position 1008 in FIG. 10C indicates that the integrated intensities of the two digital grating images are equal, and thus corresponds to a zero-position 1012 in FIG. 10D. A normalized integrated intensity differential curve 1014 can be determined by fitting (e.g., using a polynomial function or a trigonometry function) using L. The zero-position 1012 can be determined as the root of the normalized integrated intensity differential curve 1014. When the sample positioned at a height of 0, the curve 1014 can be updated, and a reference zero-position can be determined as the root of the updated curve 1014. In FIG. 10D, the distance between the zero-positions 1012 and the reference zero-position can be determined as the displacement d, and the sample height can be determined using Eqs. (1) and (2).

It should be noted that the precision of the measurement can also depend on the ratio between p (i.e., the period of the digital gratings) and Δp (the period difference between the optical grating image and the digital gratings). Typically, the larger is the ratio, the more accurate is the shape of the normalized integrated intensity differential curve 1014, and thus the more precise is the measurement of the sample height. In some implementations, such ratio can be set for several tens (e.g., 30, 40, 50, or more).

In FIGS. 5-10D, as examples, the optical grating image can have a similar shape to the digital gratings. It should be noted that the optical grating image can be similar or not similar to the digital gratings, such as in period, size, duty cycle, or any parameter. As an example, in FIG. 11, an optical grating image 1102 overlaps with the digital grating set 902 with the same periods. Correspondingly, a digital grating image set 1104 can be determined, including a third digital grating image 1106 and a fourth digital grating image 1108. The integrated intensities at optical grating lines L1-L4 of the third and fourth digital grating images 1106 and 1108 can be plotted in FIG. 12A. Integrated intensity curves 1202 and 1204 can be determined (e.g., by fitting) from the third and fourth digital grating images, respectively.

Figure 12A:
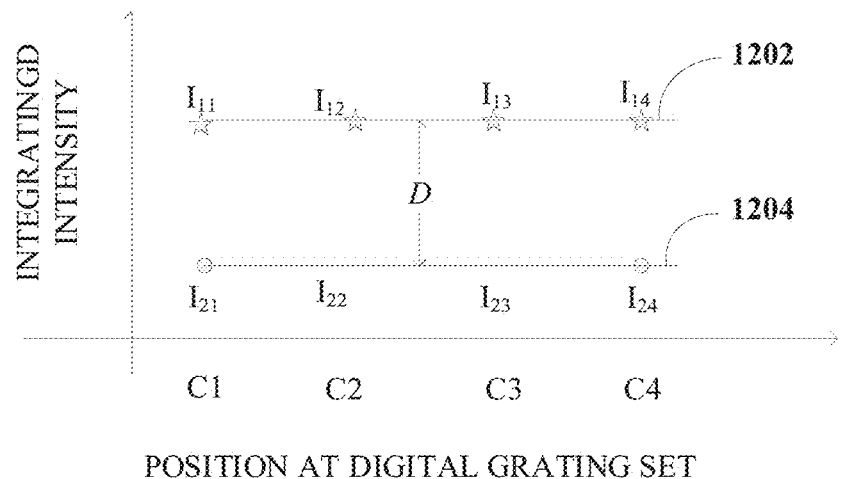
FIGS. 12A-12B are other example graphs showing integrated signal curves in some implementations of this disclosure.
Figure 12B:
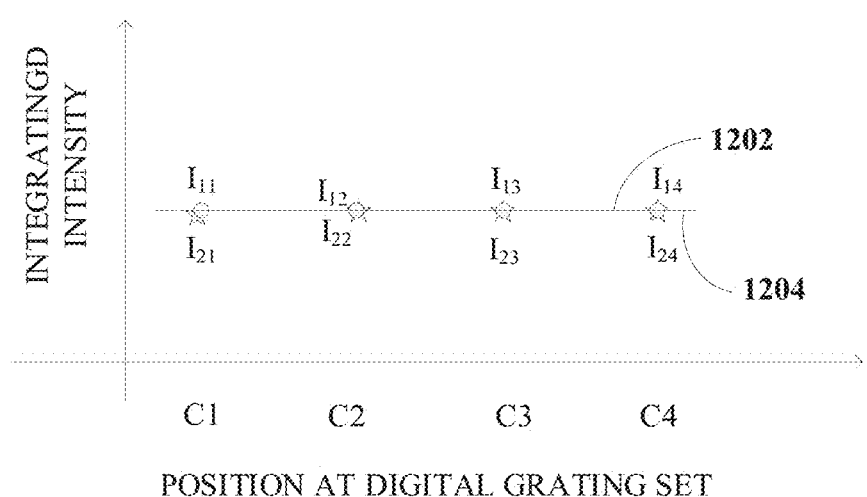

FIGS. 12A-12B are graphs showing the integrated intensities of the optical grating lines L1-L4 in FIG. 15. Compared with FIG. 10A, the integrated intensity curves 1202 and 1204 do not cross with each other in FIG. 12A, due to the optical grating image having the same period with the first and second digital gratings. The displacement x of the optical grating image on the optical sensor can have a relationship (e.g., a linear relationship) with the distance D between the integrated intensity curves 1202 and 1204. By measuring D, x can be determined, and the sample height can be determined using Eq. (1). When the optical grating image 1102 is at a reference position, the sample height can be set as 0, and the integrated intensity curves 1202 and 1204 can overlap, as shown in FIG. 12B.

In some implementations, the optical vernier caliper can be integrated with the height adjuster 118 for adjusting the sample height. For example, the optical vernier caliper can be used for continuous stage movement. In some implementations, the optical grating can be attached to the stage, and the optical sensor 114 can be used to monitor its movement. When the stage moves continuously, the normalized integrated intensity differential curve 1014 can move horizontally. The target position of the stage can correspond to a position at the digital grating set. When the zero-position 1012 reaches the reference position, the stage can be moved to the target position.

For another example, the optical vernier caliper can be used for measuring the sample height using stepping movement. For example, if the sample height is measured as not at the target height, the stage can be stepped up or down monotonously by a step distance, and the sample height is re-measured. This process can be repeated until the sample height reaches the target height.

Figure 13:
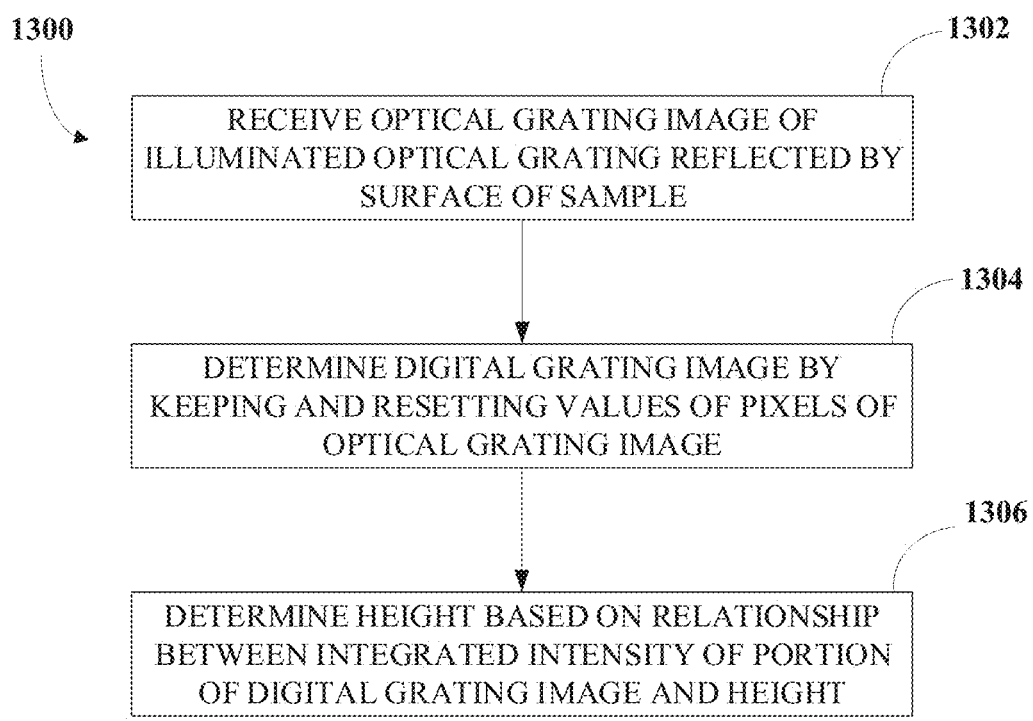
FIG. 13 is a flowchart of another example process for measuring the sample height according to implementations of this disclosure.

FIG. 13 shows an example process 1300 for measuring a height of a sample according to implementations of this disclosure. The process 1300 can be performed by hardware (e.g., chips) or software (e.g., instructions or codes executable by a processor), such as by the computing device 116.

At operation 1302, an optical grating image of an illuminated optical grating reflected by a surface of the sample is received. For example, the optical grating image can be received by an optical sensor having pixels. In some implementations, the optical sensor can include a CCD sensor. The optical sensor can also include CMOS sensor.

At operation 1304, a digital grating image is determined by keeping values of first pixels of the optical grating image and resetting values of second pixels of the optical grating image. For example, the digital grating image can be determined by a processor.

In some implementations, the first and second pixels can form a digital grating. The digital grating can have a first duty cycle and a first period. For example, the first pixels can include first lines of pixels. The second pixels can include second lines of pixels. The second lines of pixels can parallelly interleave the first lines of pixels, such as in an alternate order. In some implementations, the optical grating image can have a second duty cycle and a second period. For example, the second duty cycle can be equal to the first duty cycle (e.g., 1:1). For another example, the second period has a difference to the first period (e.g., smaller than or equal to 0.25 micrometer).

In some implementations, the operation of keeping the values of the first pixels can include multiplying the values of the first pixels with 1. The operation of resetting the values of the second pixels can include multiplying the values of the second pixels with 0.

In some implementations, multiple digital grating images can be determined. For example, a first digital grating image can be determined by keeping the values of the first pixels and resetting the values of the second pixels. A second digital grating image can be determined by resetting the values of the first pixels and keeping the values of the second pixels.

In some implementations, before determining the digital grating image, alignment between the optical grating image and the digital grating can be adjusted. For example, the alignment can be adjusted by rotating at least one of the optical grating image and the digital grating. For another example, the alignment can be adjusted by adjusting a size of the optical grating image using an optical lens.

At operation 1306, the height is determined based on a relationship between an integrated intensity of a portion of the digital grating image and the height.

In some implementations, the height is determined by operations O1-O3. At operation O1, an equal-intensity position on the optical sensor is determined. At the equal-intensity position, an integrated intensity of a first portion of the first digital grating image can be equal to an integrated intensity of a second portion of the second digital grating image.

At operation O2, a distance between the equal-intensity position and a reference position on the optical sensor is determined. For example, the height of the sample can be 0 when the equal-intensity position is the reference position.

At operation O3, the height is determined based on a relationship between the distance and the height. For example, the relationship between the distance and the height can be linear, such as shown by Eqs. (1) and (2).

In some implementations, the operation O1 can include operations O4-O6. At operation O4, at boundaries between the first and second pixels, first integrated intensities of the first digital grating image and second integrated intensities of the second digital grating image are determined.

At operation O5, at each of the boundaries, a differential integrated intensity is determined based on a difference between the first and second integrated intensities at the same boundary. Multiple differential integrated intensities can be determined at the operation O5.

At operation O6, the equal-intensity position is determined based on the differential integrated intensities.

In some implementations, a non-transitory computer-readable medium can be used for measuring a height of a sample. The non-transitory computer-readable medium can store instructions accessible and executable by a processor. For example, the non-transitory computer-readable medium can include a memory (e.g., the memory 204) and/or an external storage device (e.g., a read-only memory). In some implementations, the computing device 116 can include the non-transitory computer-readable medium.

The stored instructions can be executed by the processor to perform operations O7-O9. At operation O7, an optical grating image of an illuminated optical grating reflected by a surface of the sample is received. The operation O7 can be similar to the operation 1302.

At operation O8, a first digital grating image and a second digital grating image are determined. The first digital grating image can be determined by keeping values of first pixels of the optical grating image and resetting values of second pixels of the optical grating image. The second digital grating image can be determined by resetting the values of the first pixels and keeping the values of the second pixels.

At operation O9, the height is determined based on a relationship between the height and integrated intensities at portions of the first and second digital grating images.

As described above, it should be noted that all or a portion of aspects of the disclosure described herein can be implemented using a general-purpose computer/processor with a computer program that, when executed, carries out any of the respective techniques, algorithms and/or instructions described herein. In addition, or alternatively, for example, a special purpose computer/processor can be utilized which can contain specialized hardware for carrying out any of the techniques, algorithms, or instructions described herein.

The implementations of computing devices as described herein (and the algorithms, methods, instructions, etc., stored thereon and/or executed thereby) can be realized in hardware, software, or any combination thereof. The hardware can include, for example, computers, intellectual property (IP) cores, application-specific integrated circuits (ASICs), programmable logic arrays, optical processors, programmable logic controllers, microcode, processors, servers, microprocessors, digital signal processors or any other suitable circuit. In the claims, the term "processor" should be understood as encompassing any of the foregoing, either singly or in combination. The terms "signal" and "data" are used interchangeably. Further, portions of the computing devices do not necessarily have to be implemented in the same manner The aspects herein can be described in terms of functional block components and various processing operations. The disclosed processes and sequences can be performed alone or in any combination. Functional blocks can be realized by any number of hardware and/or software components that perform the specified functions. For example, the described aspects can employ various integrated circuit components, e.g., memory elements, processing elements, logic elements, look-up tables, and the like, which can carry out a variety of functions under the control of one or more microprocessors or other control devices. Similarly, where the elements of the described aspects are implemented using software programming or software elements the disclosure can be implemented with any programming or scripting languages such as C, C++, Java, assembler, or the like, with the various algorithms being implemented with any combination of data structures, objects, processes, routines, or other programming elements. Functional aspects can be implemented in algorithms that execute on one or more processors. Furthermore, the aspects of the disclosure could employ any number of techniques for electronics configuration, signal processing and/or control, data processing and the like. The words "mechanism" and "element" are used broadly and are not limited to mechanical or physical implementations or aspects, but can include software routines in conjunction with processors, etc.

Implementations or portions of implementations of the above disclosure can take the form of a computer program product accessible from, for example, a computer-usable or computer-readable medium. A computer-usable or computer-readable medium can be any device that can, for example, tangibly contain, store, communicate, or transport a program or data structure for use by or in connection with any processor. The medium can be, for example, an electronic, magnetic, optical, electromagnetic, or a semiconductor device, such as a hard disc drive, a memory device, a solid-state drive, a flash drive, or an optical drive. Other suitable mediums are also available. Such computer-usable or computer-readable media can be referred to as non-transitory memory or media. A memory of an apparatus described herein, unless otherwise specified, does not have to be physically contained in the apparatus, but is one that can be accessed remotely by the apparatus, and does not have to be contiguous with other memory that might be physically contained by the apparatus.

Any of the individual or combined functions described herein as being performed as examples of the disclosure can be implemented using machine-readable instructions in the form of code for operation of any or any combination of the aforementioned computational hardware. The computational code can be implemented in the form of one or more modules by which individual or combined functions can be performed as a computational tool, the input and output data of each module being passed to/from one or more further module during operation of the methods and systems described herein.

Information, data, and signals can be represented using a variety of different technologies and techniques. For example, any data, instructions, commands, information, signals, bits, symbols, and chips referenced herein can be represented by voltages, currents, electromagnetic waves, magnetic fields or particles, optical fields or particles, other items, or a combination of the foregoing.

The particular aspects shown and described herein are illustrative examples of the disclosure and are not intended to otherwise limit the scope of the disclosure in any way. For the sake of brevity, electronics, control systems, software development and other functional aspects of the systems (and components of the individual operating components of the systems) cannot be described in detail. Furthermore, the connecting lines or connectors shown in the various figures presented are intended to represent exemplary functional relationships and/or physical or logical couplings between the various elements. Many alternative or additional functional relationships, physical connections or logical connections can be present in a practical device.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this disclosure, the term "or" is intended to mean an inclusive "or" rather than an exclusive "or" for two or more elements it conjoins. That is, unless specified otherwise, or clear from context, "X includes A or B" is intended to mean any of the natural inclusive permutations. In other words, if X includes A; X includes B; or X includes both A and B, then "X includes A or B" is satisfied under any of the foregoing instances. The term "and/or" used in this disclosure is intended to mean an "and" or an inclusive "or." That is, unless specified otherwise, or clear from context, "X includes A, B, and/or C" is intended to mean X can include any combinations of A, B, and C. In other words, if X includes A; X includes B; X includes C; X includes both A and B; X includes both B and C; X includes both A and C; or X includes all A, B, and C, then "X includes A and/or B" is satisfied under any of the foregoing instances. Similarly, "X includes at least one of A, B, and C" is intended to be used as an equivalent of "X includes A, B, and/or C." In addition, the articles "a" and "an" as used in this application and the appended claims should generally be construed to mean "one or more" unless specified otherwise or clear from context to be directed to a singular form. Moreover, use of the term "an aspect" or "one aspect" throughout is not intended to mean the same implementation or aspect unless described as such.

The use of "including" or "having" and variations thereof herein is meant to encompass the items listed thereafter and equivalents thereof as well as additional items. Unless specified or limited otherwise, the terms "mounted," "connected," 'supported," and "coupled" and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, recitation of ranges of values herein is merely intended to serve as a shorthand method of referring individually to each separate value falling within the range, unless otherwise indicated herein, and each separate value is incorporated into the specification as if it were individually recited herein. Finally, the operations of all methods described herein are performable in any suitable order unless otherwise indicated herein or otherwise clearly contradicted by context. The use of any and all examples, or exemplary language (e.g., "such as") provided herein, is intended merely to better illuminate the disclosure, and does not pose a limitation on the scope of the disclosure unless otherwise claimed.

It should be understood that although this disclosure uses terms such as first, second, third, etc., the disclosure should not be limited to these terms. These terms are used only to distinguish similar types of information from each other. For example, without departing from the scope of this disclosure, a first information can also be referred to as a second information; and similarly, a second information can also be referred to as a first information. Depending on the context, the words "if" as used herein can be interpreted as "when," "while," or "in response to."

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for measuring a height of a sample, comprising:
    receiving, by an optical sensor having pixels, an optical grating image of an illuminated optical grating reflected by a surface of the sample;
    determining, by a processor, a digital grating image by keeping values of first pixels of the optical grating image and resetting values of second pixels of the optical grating image wherein keeping the values of the first pixels comprises multiplying the values of the first pixels with 1, and resetting the values of the second pixels comprises multiplying the values of the second pixels with 0; and
    determining the height based on a relationship between an integrated intensity of a portion of the digital grating image and the height.

2. The method of claim 1, wherein the first pixels and second pixels form a digital grating having a first duty cycle and a first period, wherein the first pixels being grouped into first lines of pixels, and the second pixels being grouped into second lines of pixels, and wherein the second lines of pixels parallelly interleave the first lines of pixels.

3. The method of claim 2, further comprising:
    adjusting alignment between the optical grating image and the digital grating by at least one of: rotating at least one of the optical grating image and the digital grating, and adjusting a size of the optical grating image using an optical lens.

4. The method of claim 2, wherein the optical grating image have a second duty cycle and a second period, wherein
    the second duty cycle is equal to the first duty cycle, and
    the second period has a difference to the first period.

5. The method of claim 4, wherein the first and second duty cycles are 1:1, and the difference is smaller than or equal to one half of the first period.

6. The method of claim 1, wherein determining the digital grating image comprises:
    determining a first digital grating image by keeping the values of the first pixels and resetting the values of the second pixels; and
    determining a second digital grating image by resetting the values of the first pixels and keeping the values of the second pixels.

7. The method of claim 6, wherein determining the height comprises:
    determining an equal-intensity position on the optical sensor, wherein, at the equal-intensity position, an integrated intensity of a first portion of the first digital grating image is equal to an integrated intensity of a second portion of the second digital grating image;
    determining a distance between the equal-intensity position and a reference position on the optical sensor, wherein the height is 0 when the equal-intensity position is the reference position; and
    determining the height based on a linear relationship between the distance and the height.

8. The method of claim 7, wherein determining the equal-intensity position on the optical sensor comprises:
    determining, at boundaries between the first and second pixels, first integrated intensities of the first digital grating image and second integrated intensities of the second digital grating image;
    determining, at each of the boundaries, a differential integrated intensity based on a difference between the first and second integrated intensities at the same boundary; and
    determining the equal-intensity position based on the differential integrated intensities.

9. An apparatus for measuring a height of a sample, comprising:
    an optical sensor having pixels;
    a processor; and
    a memory coupled to the processor, the memory configured to store instructions which when executed by the processor become operational with the processor to:

receive, by the optical sensor, an optical grating image of an illuminated optical grating reflected by a surface of the sample;

determine a digital grating image by keeping values of first pixels of the optical grating image and resetting values of second pixels of the optical grating image, wherein keeping the values of the first pixels comprises multiplying the values of the first pixels with a first value, and resetting the values of the second pixels comprises multiplying the values of the second pixels with a second value; and determine the height based on a relationship between an integrated intensity of a portion of the digital grating image and the height.

10. The apparatus of claim 9, wherein the optical sensor comprises one of a charge-coupled device (CCD) sensor and a complementary metal oxide semiconductor (CMOS) sensor.

11. The apparatus of claim 9, wherein the first and second pixels form a digital grating having a first duty cycle and a first period, wherein the first pixels being grouped into first lines of pixels, and the second pixels being grouped into second lines of pixels, and wherein the second lines of pixels parallelly interleave the first lines of pixels; and the optical grating image has a second duty cycle and a second period, wherein the second duty cycle is equal to the first duty cycle, and the second period has a difference to the first period.

12. The apparatus of claim 9, wherein the memory further comprises instructions which when executed by the processor become operational with the processor to:

adjust alignment between the optical grating image and the digital grating by at least one of: rotating at least one of the optical grating image and the digital grating, and adjusting a size of the optical grating image using an optical lens.

13. The apparatus of claim 9, wherein the first value is equal to 1, and wherein the second value is equal to 0.

14. The apparatus of claim 9, wherein the memory comprising the instructions operational with the processor to determine the digital grating image further comprises instructions which when executed by the processor become operational to:

determine a first digital grating image by keeping the values of the first pixels and resetting the values of the second pixels; and determine a second digital grating image by resetting the values of the first pixels and keeping the values of the second pixels.

15. The apparatus of claim 14, wherein the memory comprising the instructions operational with the processor to determine the height further comprises instructions which when executed by the processor become operational with the processor to:

determine an equal-intensity position on the optical sensor, wherein, at the equal-intensity position, an integrated intensity of a first portion of the first digital grating image is equal to an integrated intensity of a second portion of the second digital grating image;

determine a distance between the equal-intensity position and a reference position on the optical sensor, wherein the height is 0 when the equal-intensity position is the reference position; and determine the height based on a linear relationship between the distance and the height.

16. The apparatus of claim 15, wherein the memory comprising the instructions operational with the processor to determine the equal-intensity position on the optical sensor further comprises instructions which when executed by the processor become operational with the processor to:

determine, at boundaries between the first and second pixels, first integrated intensities of the first digital grating image and second integrated intensities of the second digital grating image;

determine, at each of the boundaries, a differential integrated intensity based on a difference between the first and second integrated intensities at the same boundary; and determine the equal-intensity position based on the differential integrated intensities.

17. A non-transitory computer-readable medium, comprising instructions for measuring a height of a sample which when executed by a processor become operational with the processor to:

receive, by an optical sensor having pixels, an optical grating image of an illuminated optical grating reflected by a surface of the sample;

determine a first digital grating image by keeping values of first pixels of the optical grating image and resetting values of second pixels of the optical grating image, and a second digital grating image by resetting the values of the first pixels and keeping the values of the second pixels, wherein keeping the values of the first pixels comprises multiplying the values of the first pixels with a first value, and resetting the values of the second pixels comprises multiplying the values of the second pixels with a second value; and determine the height based on a relationship between the height and integrated intensities at portions of the first and second digital grating images.

18. The non-transitory computer-readable medium of claim 17, wherein the first value is 1, and wherein the second value is 0.

19. The non-transitory computer-readable medium of claim 17, wherein the instructions operational with the processor to determine the height further comprise instructions which when executed by the processor become operational with the processor to:

determine an equal-intensity position on the optical sensor, wherein, at the equal-intensity position, an integrated intensity of a first portion of the first digital grating image is equal to an integrated intensity of a second portion of the second digital grating image;

determine a distance between the equal-intensity position and a reference position on the optical sensor, wherein the height is 0 when the equal-intensity position is the reference position; and determine the height based on a linear relationship between the distance and the height.

20. The apparatus of claim 9, wherein multiplying the values of the first pixels with a first value, and resetting the values of the second pixels comprises multiplying the values of the second pixels with a second value comprises modulating at least some of the first pixels or at least some of the second pixels with a phase.

* * * * *